United States Patent
Mei

(10) Patent No.: US 12,289,980 B2
(45) Date of Patent: Apr. 29, 2025

(54) NANOPARTICLE AND METHOD FOR CROSS-LINKING OF ADJACENT NANOPARTICLES AMONG LIGANDS OF ADJACENT NANOPARTICLES BY DELOCALIZING ELECTRONS TO A SURFACE OF THE NANOPARTICLES TO CONTACT THE LIGAND

(71) Applicant: BOE Technology Group Co., Ltd., Beijing (CN)

(72) Inventor: Wenhai Mei, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 980 days.

(21) Appl. No.: 17/357,045

(22) Filed: Jun. 24, 2021

(65) Prior Publication Data

US 2022/0165952 A1    May 26, 2022

(30) Foreign Application Priority Data

Nov. 20, 2020    (CN) .......................... 202011311474.X

(51) Int. Cl.
*H01L 51/00*      (2006.01)
*C09K 11/06*      (2006.01)
(Continued)

(52) U.S. Cl.
CPC ............ *H10K 71/233* (2023.02); *C09K 11/06* (2013.01); *C09K 11/883* (2013.01);
(Continued)

(58) Field of Classification Search
CPC .... H10K 71/233; H10K 50/125; H10K 71/00; H10K 85/381; H10K 50/115;
(Continued)

(56) References Cited

U.S. PATENT DOCUMENTS 10,224,483 B2    3/2019    Li et al.
2018/0108842 A1*   4/2018    Li ......................... H10K 85/50
2021/0388259 A1    12/2021    Mei et al.

FOREIGN PATENT DOCUMENTS

CN      105552241 A    5/2016
CN      109935724 A    6/2019
(Continued)

OTHER PUBLICATIONS

Chinese Office Action, mailed May 7, 2022, from China Patent Application No. 202011311474.X filed Nov. 20, 2020.
(Continued)

*Primary Examiner* — Ermias T Woldegeorgis
(74) *Attorney, Agent, or Firm* — Workman Nydegger

(57) ABSTRACT

The present application can provide a nanoparticle, a method for patterning a nanoparticle layer and a light emitting device. When the nanoparticle provided by the present application is adopted for manufacturing a light emitting layer of the light emitting device, a cross-linking reaction occurs among first ligands of adjacent nanoparticles under irradiation of ultraviolet light, and the cross-linked nanoparticles may be firmly connected to a front film layer of the light emitting layer, so that when a developing solution is adopted for developing treatment, the cross-linked nanoparticles are not insoluble in the developing solution and are retained while non-cross-linked nanoparticles are dissolved in the developing solution and are separated from the front film layer to be removed, therefore completing patterning of the nanoparticle layer.

18 Claims, 13 Drawing Sheets

(51) Int. Cl.
  *C09K 11/88* (2006.01)
  *H10K 50/125* (2023.01)
  *H10K 71/00* (2023.01)
  *H10K 71/20* (2023.01)
  *H10K 85/30* (2023.01)
  *H10K 50/115* (2023.01)
(52) U.S. Cl.
  CPC ........... *H10K 50/125* (2023.02); *H10K 71/00* (2023.02); *H10K 85/381* (2023.02); *H10K 50/115* (2023.02)
(58) Field of Classification Search
  CPC ............. H10K 2102/321; H10K 59/12; H10K 71/166; H10K 71/211; C09K 11/06; C09K 11/883; C09K 11/025; B82Y 40/00; G03F 7/2002
  See application file for complete search history.

(56) References Cited

FOREIGN PATENT DOCUMENTS

| | | |
|---|---|---|
| CN | 110590549 A | 12/2019 |
| CN | 111781803 A | 10/2020 |
| EP | 3404733 A1 | 11/2018 |
| WO | 2017121163 A1 | 7/2017 |
| WO | 2021063166 A1 | 4/2021 |

OTHER PUBLICATIONS

First Office Action for CN Application No. 202011311474.X, mailed May 7, 2022, 9 pages.

\* cited by examiner

NANOPARTICLE AND METHOD FOR CROSS-LINKING OF ADJACENT NANOPARTICLES AMONG LIGANDS OF ADJACENT NANOPARTICLES BY DELOCALIZING ELECTRONS TO A SURFACE OF THE NANOPARTICLES TO CONTACT THE LIGAND

CROSS-REFERENCE TO RELATED APPLICATIONS

The present application is based on and claims priority under 35 U.S.C. 119 to Chinese Patent Application No. 202011311474.X, filed on Nov. 20, 2020, in the China National Intellectual Property Administration, the entire content of which is incorporated herein by reference.

FIELD

The present application relates to the field of display, in particular to a nanoparticle, a method for patterning a nanoparticle layer and a light emitting device.

BACKGROUND

Quantum Dots (QDs), also known as nanocrystals, are nanometer particles composed of elements of the II-VI group or III-V group. Particle size of the quantum dots generally ranges from 1 to 20 nm. Because electrons and holes are quantum limited, a continuous energy band structure becomes a discrete energy level structure, which may emit fluorescence upon excitation.

With in-depth development of a quantum dot preparation technology, the stability and luminous efficiency of the quantum dots are continuously improved, researches on Quantum Light Emitting Diodes (QLEDs) are continuously deepened, and an application prospect of the QLEDs in a display field is getting brighter. However, the current generation efficiency of the QLEDs has not yet reached a level of mass production. The most important reason is that a breakthrough of high-resolution patterning technology of the QLEDs has not yet been made.

SUMMARY

An embodiment of the present application provides a nanoparticle, including: a nanometer particle, and a first ligand coordinated on a surface of the nanometer particle; where under irradiation of ultraviolet light, the nanometer particle is configured to absorb photons to generate electrons in an excited state, and the electrons are delocalized to the surface of the nanometer particle to be in contact with the first ligand; and under an action of a transfer reaction of the electrons, a cross-linking reaction occurs among first ligands of adjacent nanoparticles.

Correspondingly, an embodiment of the present application further provides a method for patterning a nanoparticle layer, including:

forming a nanoparticle film layer on a substrate, where the nanoparticle film layer includes the above-mentioned nanoparticle provided by the embodiment of the present application;

irradiating a reserved area of the nanoparticle film layer with ultraviolet light, where under irradiation of the ultraviolet light, a nanometer particle of the nanoparticle absorbs photons to generate electrons in an excited state, and the electrons are delocalized to a surface of the nanometer particle to be in contact with a first ligand; and under an action of a transfer reaction of the electrons, a cross-linking reaction occurs among first ligands of adjacent nanoparticles to form a cross-linked network, which is fixed on the substrate; and removing nanoparticles not irradiated by the ultraviolet light to form a patterned nanoparticle layer in the reserved area.

Correspondingly, an embodiment of the present application further provides a light emitting device, including an anode, a nanoparticle layer and a cathode arranged in a stacked mode. The nanoparticle layer includes a nanometer particle and a cross-linked network attached to a surface of the nanometer particle, and formed by a cross-linking reaction of a first ligand of the above-mentioned nanoparticle provided by the embodiment of the present application.

Correspondingly, an embodiment of the present application further provides a display device, including the above-mentioned light emitting device provided by the embodiment of the present application.

DETAILED DESCRIPTION OF THE EMBODIMENTS

In order to make the objectives, technical solutions, and advantages of the present application clearer, specific implementations of a method for patterning a quantum dot layer, a manufacturing method of a light emitting device and a related device provided by embodiments of the present application will be described in detail below in conjunction with the accompanying drawings.

The embodiments described below with reference to the accompanying drawings are exemplary, are only used to explain the present application, and cannot be construed as a limitation to the present application.

Figure 1:
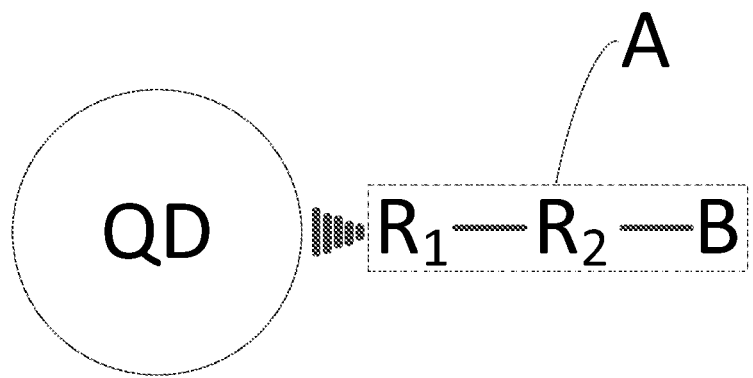
FIG. 1 a schematic structural diagram of a nanoparticle provided by an embodiment of the present application.

An embodiment of the present application provides a nanoparticle, as shown in FIG. 1, including: a nanometer particle (indicated by "QD"), and a first ligand A coordinated on a surface of the nanometer particle QD.

Figure 2:
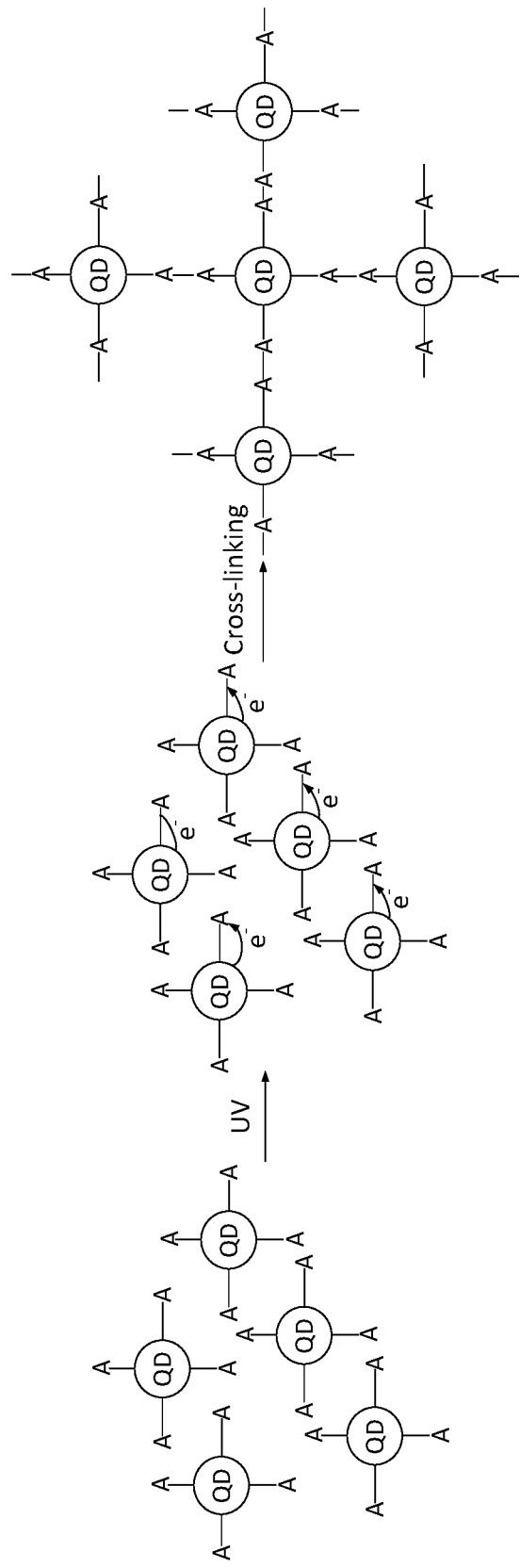
FIG. 2 is a schematic structural diagram of the nanoparticle shown in FIG. 1 undergoing cross-linking under an action of ultraviolet light.

As shown in FIG. 2, taking a plurality of nanoparticles as an example, the nanometer particles QD generate electrons ($e^-$) in an excited state under irradiation of ultraviolet light (indicated by "UV"), and the electrons ($e^-$) are delocalized to the surfaces of the nanometer particles QD to be in contact with the first ligands A. For illustrative purposes, FIG. 2 only illustrates that the electrons ($e^-$) in the excited state generated by a part of nanoparticles under irradiation of the ultraviolet light UV are delocalized to the surfaces of the nanometer particles QD to be in contact with the first ligands A. Under an action of a transfer reaction of the electrons ($e^-$), a cross-linking reaction occurs among the first ligands A.

According to the above-mentioned nanoparticle provided by the embodiment of the present application, when the nanoparticle provided by the present application is adopted for manufacturing a light emitting layer of a light emitting device, the cross-linking reaction occurs among first ligands of adjacent nanoparticles under irradiation of the ultraviolet light, and the cross-linked nanoparticles may be firmly connected to a front film layer of the light emitting layer, so that when a developing solution is adopted for developing treatment, the cross-linked nanoparticles are not insoluble in the developing solution and are retained while non-cross-linked nanoparticles are dissolved in the developing solution and are separated from the front film layer to be removed, therefore completing patterning of a nanoparticle layer. The present application may complete patterning of the nanoparticle layer without adopting ink-jet printing and can form nanoparticles with a high resolution and a good performance. When the nanoparticles include quantum dots, a resolution of quantum dot patterning may be improved, so that a display device with better display performance is achieved.

In some embodiments, as shown in FIG. 1, the first ligand A of the above-mentioned nanoparticle provided by the embodiment of the present application includes: a cross-linking group B, a linking group $R_2$ joined to the cross-linking group B, and a coordinating group $R_1$ joined to the connecting group $R_2$;

the coordinating group $R_1$ is in coordinate bond with the nanometer particle QD;

under the action of the transfer reaction of the electrons ($e^-$), a cross-linking reaction occurs among the cross-linking groups B, thereby forming a stable cross-linking network structure between the nanoparticles.

Figure 3:
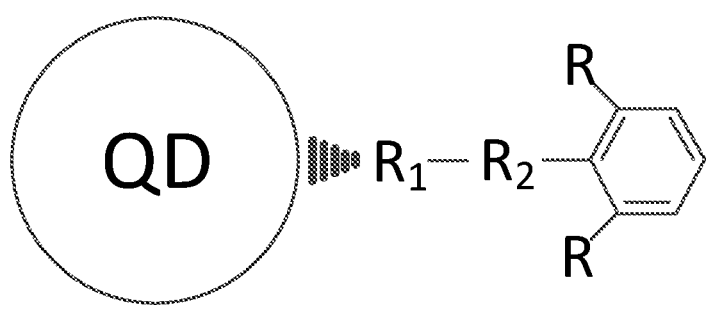
FIG. 3 is a schematic structural diagram of another nanoparticle provided by an embodiment of the present application.

In some embodiments, as shown in FIG. 3, the first ligand A of the above-mentioned nanoparticle provided by the embodiment of the present application is

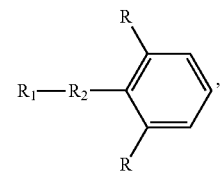

where $R_1$ is the coordinating group, can be coordinated with the nanometer particle QD, and may be —$NH_2$, —SH, —COOH or —P=O, which are not listed here;

$R_2$ is the linking group, $R_2$ may be $(CH_2)_n$, and n≤8. Here, a length of a carbon chain in the linking group $R_2$ may determine the solubility of the nanoparticle, and can be adjusted to suit the actual needs; and

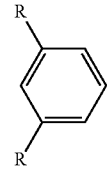

is the cross-linking group, and since the cross-linking group is cross-linked under the action of a transfer reaction of the electrons, in order to make the cross-linking reaction easy to occur, R is an electron donating group. R may be —O⁻, —NR$_2$, —NH$_2$, —OH, —OR, —NHCOR or —OCOR, etc., which are not listed here.

In some embodiments, in the above-mentioned nanoparticle provided by the embodiment of the present application, the cross-linking group

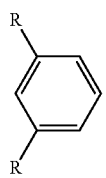

undergoes the cross-linking reaction under irradiation of the ultraviolet light and under an action of carbon tetrachloride (CCl$_4$) and oxygen (O$_2$):

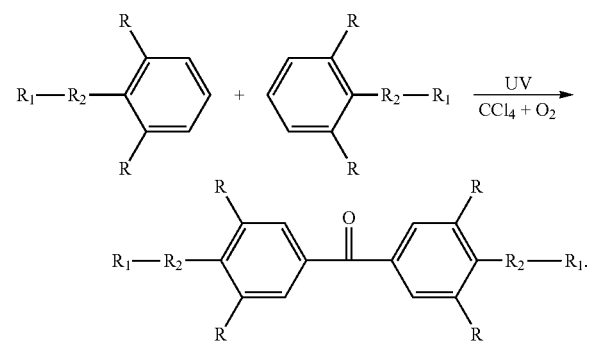

As carbon tetrachloride (CCl$_4$) and oxygen (O$_2$) initiate the formation of carbon trichloride radicals under the action of the transfer reaction of the electrons, in the above-mentioned reaction formula, the electron donating group R in the nanoparticle on a left side before the reaction is able to push electrons to a position between a right side of a benzene ring and the R, and the electron donating group R in the nanoparticle on a right side before the reaction is able to push electrons to a position between a left side of the benzene ring and the R. Electron clouds in these two positions are increased, and these two positions are easily attacked by the carbon trichloride radicals to form a structure of carbonyl substituted benzene ring after the reaction as shown. That is, the cross-linking group

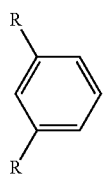

is subjected to the cross-linking reaction under irradiation of the ultraviolet light and under the action of carbon tetrachloride (CCl$_4$) and oxygen (O$_2$), i.e. a carbonyl group is formed by coupling aromatic rings in carbon tetrachloride to achieve a cross-linking effect.

Figure 4:
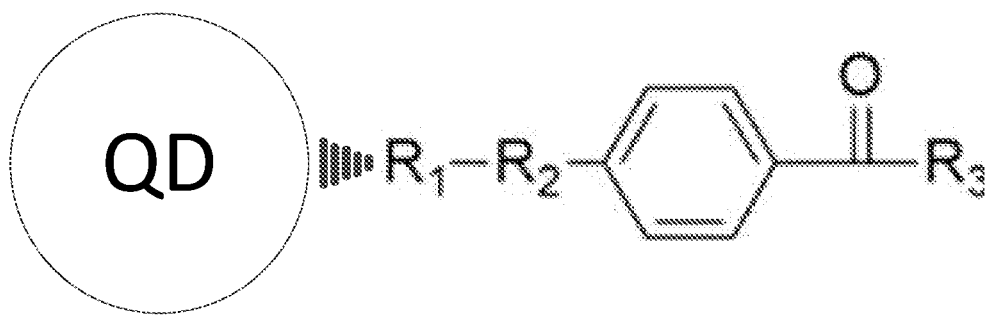
FIG. 4 is a schematic structural diagram of yet another nanoparticle provided by an embodiment of the present application.

In some embodiments, as shown in FIG. 4, the first ligand A of the above-mentioned nanoparticle provided by the embodiment of the present application is

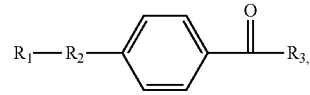

where
$R_1$ is the coordinating group, can be coordinated with the nanometer particle QD, and may be —NH$_2$, —SH, —COOH or —P=O, which are not listed here;
$R_2$ is the linking group, $R_2$ may be (CH$_2$)$_n$ or

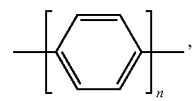

and $n \leq 8$. Here, a length of a carbon chain or the number of benzene rings in the linking group $R_2$ may determine the solubility of the nanoparticle, and the length of the carbon chain or the number of benzene rings may be adjusted to suit the actual needs; and

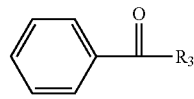

is the cross-linking group, $R_3$ is H or (CH$_2$)$_n$CH3, and $n \leq 8$.

In some embodiments, in the above-mentioned nanoparticle provided by the embodiment of the present application, the cross-linking group

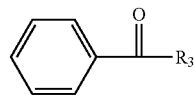

undergoes the cross-linking reaction under irradiation of the ultraviolet light:

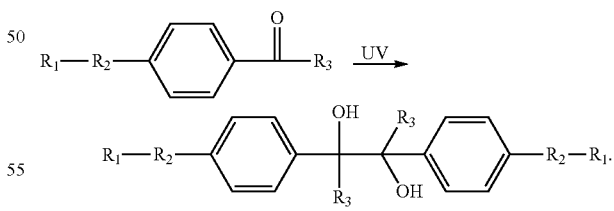

Under irradiation of the ultraviolet light, carbonyl in the cross-linking group

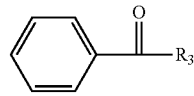

opens a double bond of the carbonyl under the action of the generated free radicals to form free radicals for carbon-carbon coupling, so that the nanoparticles are cross-linked together.

Figure 5:
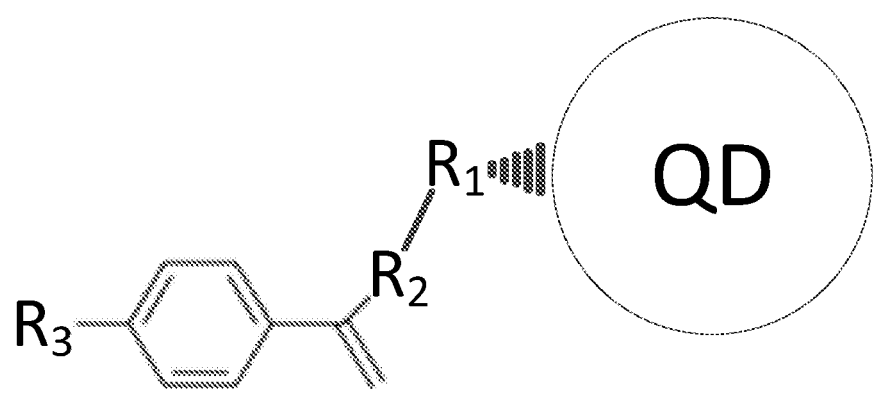
FIG. 5 is a schematic structural diagram of yet another nanoparticle provided by an embodiment of the present application.

In some embodiments, when the nanoparticle provided by the present application is adopted for manufacturing the light emitting layer of the light emitting device, since the nanoparticles are uniformly dispersed in a solution, as shown in FIG. 5, first ligands A of a first part of the nanoparticles in the nanoparticles provided by the embodiment of the present application may be

Figure 6:
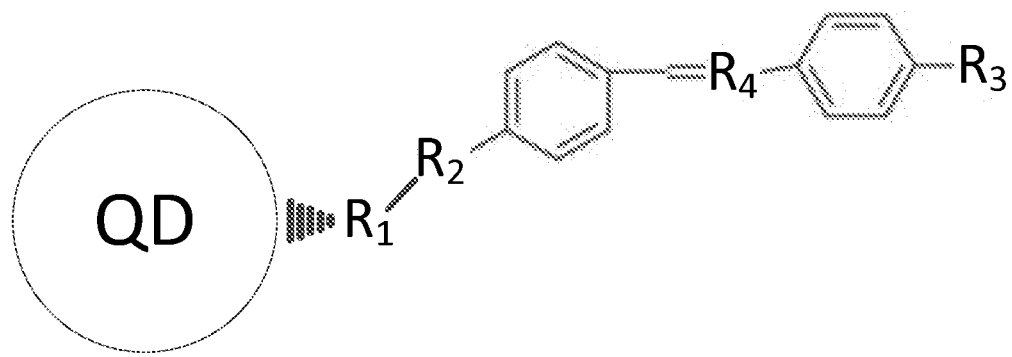
FIG. 6 is a schematic structural diagram of yet another nanoparticle provided by an embodiment of the present application.

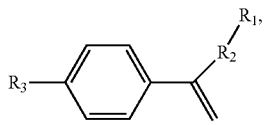

and as shown in FIG. 6, first ligands A of a second part of nanoparticles in the nanoparticles provided by the embodiment of the present application may be

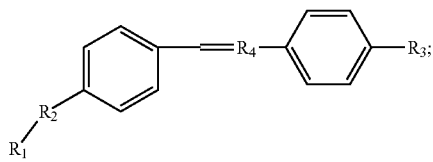

where
$R_1$ is the coordinating group, can be coordinated with the nanometer particle QD, and may be —$NH_2$, —SH, —COOH or —P=O, which are not listed here;
$R_2$ is the linking group, $R_2$ is $(CH_2)_n$, and $n \leq 8$. Here, a length of a carbon chain in the linking group $R_2$ may determine the solubility of the nanoparticle, and may be adjusted to suit the actual needs;

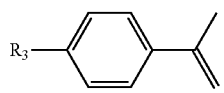

is the cross-linking group of the first part of nanoparticles, $R_3$ is $(CH_2)_n CH3$, and $n \leq 8$; and

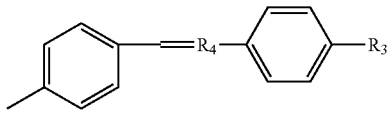

is the cross-linking group of the second part of nanoparticles, $R_3$ is $(CH_2)_n CH3$, $n \leq 8$, and $R_4$ is CH or N. In

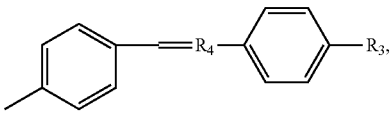

a benzene ring, a carbon-carbon double bond and a benzene ring may form a conjugated structure. Under the action of the transfer reaction of the electrons, the electrons on the benzene rings may be gathered on the carbon-carbon double bond, and the carbon-carbon double bond in

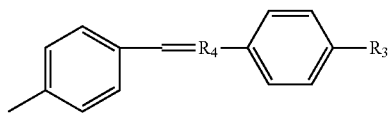

and the carbon-carbon double bond in

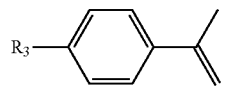

easily induced by electrons to undergo a ring-forming reaction. That is, a cross-linking effect is achieved through an addition ring-forming reaction between olefin and olefin, thereby cross-linking the nanoparticles.

In some embodiments, the cross-linking group

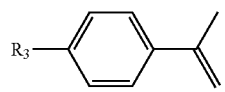

of the first part of nanoparticles and the cross-linking group

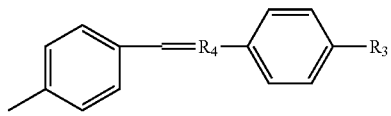

of the second part of nanoparticles undergo the cross-linking reaction under irradiation of the ultraviolet light UV:

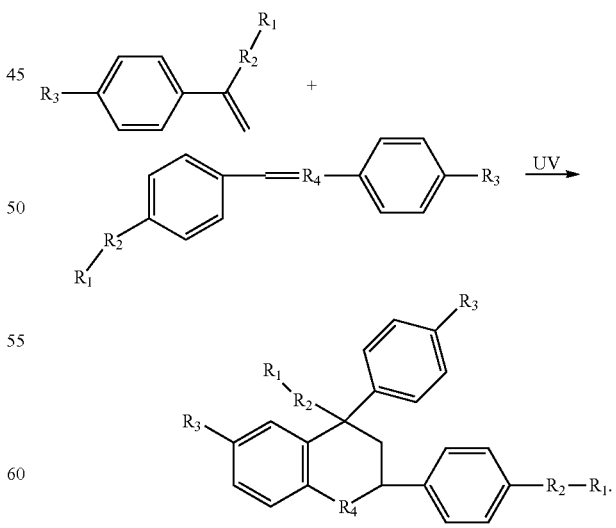

On the one hand, the first ligand of the nanoparticle provided by the embodiment of the present application contains a group that may catalyze the cross-linking reaction by the transfer reaction of the electrons under irradiation of the ultraviolet light, and on the other hand, the cross-linking group of the first ligand contains an aromatic structure. When the nanoparticle provided by the present application is adopted for manufacturing the light emitting layer of the light emitting device, the nanoparticle is more conducive to carrier transmission compared with an alkane chain with insulating properties.

In summary, the first ligand of the nanoparticle provided in the embodiment of the present application is a group that can undergo chemical reactions through the electron transfer, mainly including the following two types of reactions: first, the cross-linking reaction, where the cross-linking group is characterized by containing a benzophenone structure unit and uses the generated free radicals to carry out the coupling reaction or carbon trichloride radicals initiated by carbon tetrachloride may also carry out a substitution reaction on the aromatic ring; and second, the addition reaction, where the cross-linking group is characterized by containing the carbon-carbon double bond or a carbon-nitrogen double bond, and the carbon-carbon double bond or the carbon-nitrogen double bond is used to form a ring under the induction of electrons to realize curing and cross-linking between the first ligands. The embodiment of the present application takes the carbon-carbon double bond as an example. Of course, the cross-linking group may be other structures containing carbon-nitrogen double bonds that may undergo the addition reaction under the action of the ultraviolet light, which are not listed here.

Figure 7:
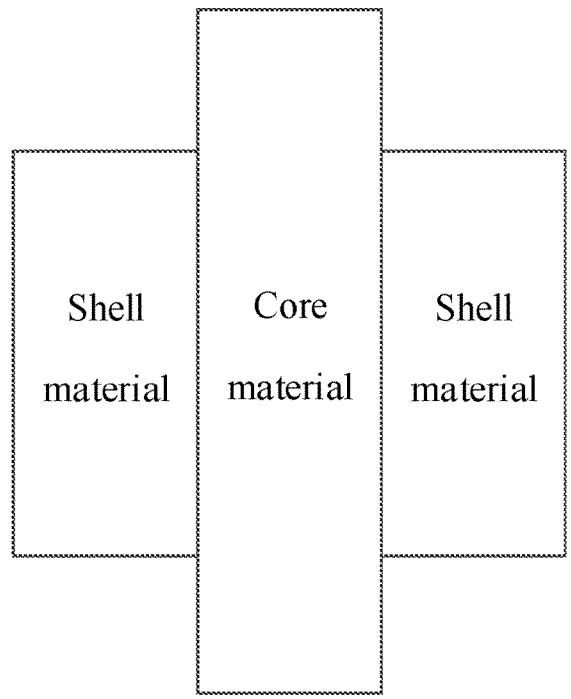
FIG. 7 is a schematic structural diagram of a nanoparticle with a core-shell structure provided by an embodiment of the present application.
Figure 8:
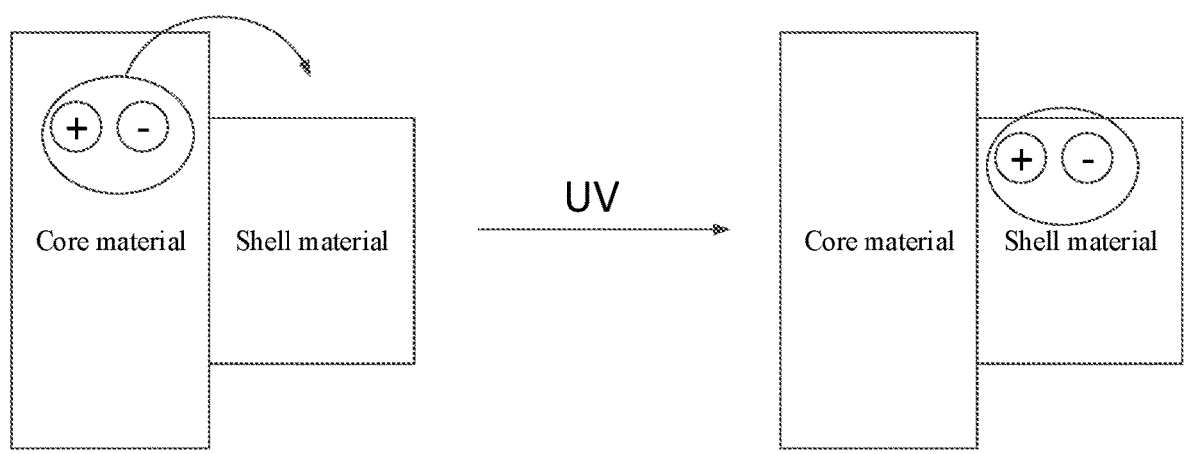
FIG. 8 is a schematic structural diagram of an electron transfer occurring in the nanoparticle shown in FIG. 7.

In some embodiments, in the above-mentioned nanoparticle provided by the embodiment of the present application, the nanometer particle may be a quantum dot with an inorganic core structure, and the first ligand is coordinated on a surface of the nanometer particle with the inorganic core structure; or as shown in FIG. 7, the quantum dot is a nanometer particle with an inorganic core structure and an inorganic shell structure, the first ligand is coordinated on a surface of the nanometer with the inorganic core structure and the inorganic shell structure, and a band gap of a shell material is smaller than a band gap of a core material. The quantum dot with the inorganic core structure and the inorganic shell structure may passivate defects on a surface of the quantum dot and improve the luminous efficiency of the quantum dot. As shown in FIG. 8, in order to achieve that electrons in an excited state generated by the quantum dot with the inorganic core structure and the inorganic shell structure under irradiation of the ultraviolet light are easily delocalized to a surface of a quantum dot shell, the band gap of the shell material is smaller than the band gap of the core material.

In some embodiments, in the above-mentioned nanoparticles provided by the embodiment of the present application, the nanoparticles include but are not limited to CdS, CdSe, ZnSe, InP, PbS, CsPbCl3, CsPbBr3, CsPhI3, CdS/ZnS, CdSe/CdSe, CdSe/ZnS, ZnSe, InP/ZnS, PbS/ZnS, CsPbCl3/ZnS, CsPbBr3/ZnS, CsPhI3/ZnS, and other quantum dots.

Figure 9:
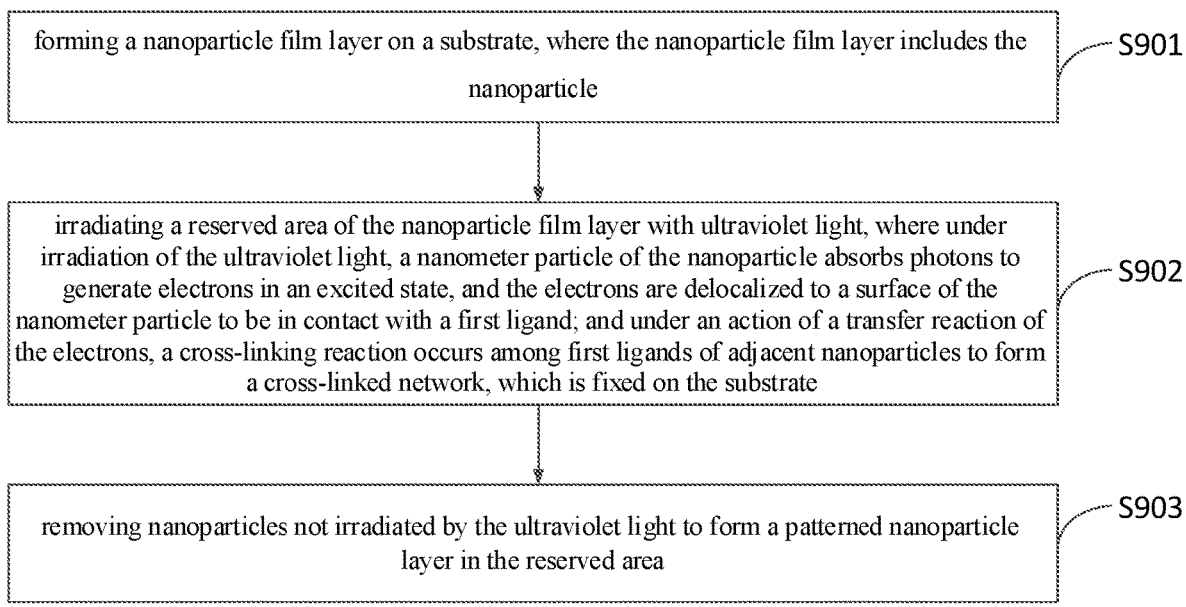
FIG. 9 is a flow chart of a method for patterning a nanoparticle layer provided by an embodiment of the present application.

Based on the same inventive concept, an embodiment of the present application further provides a method for patterning a nanoparticle layer, as shown in FIG. 9, including:

S901, forming a nanoparticle film layer on a substrate, where the nanoparticle film layer includes the above-mentioned nanoparticle provided by the embodiment of the present application;

S902, irradiating a reserved area of the nanoparticle film layer with ultraviolet light, where under irradiation of the ultraviolet light, a nanometer particle of the nanoparticle absorbs photons to generate electrons in an excited state, and the electrons are delocalized to a surface of the nanometer particle to be in contact with a first ligand; and under an action of a transfer reaction of the electrons, a cross-linking reaction occurs among first ligands of adjacent nanoparticles to form a cross-linked network, which is fixed on the substrate; and S903, removing nanoparticles not irradiated by the ultraviolet light to form a patterned nanoparticle layer in the reserved area.

In the above-mentioned method for patterning the nanoparticle layer provided by the embodiment of the present application, when the nanoparticle of the present application is used to manufacture a light emitting layer of a light emitting device, a cross-linking reaction occurs among first ligands of adjacent nanoparticles under irradiation of the ultraviolet light, and the cross-linked nanoparticles may be firmly connected to a front film layer of the light emitting layer, so that when a developing solution is adopted for developing treatment, the cross-linked nanoparticles are not insoluble in the developing solution and are retained while non-cross-linked nanoparticles are dissolved in the developing solution and are separated from the front film layer to be removed, therefore completing patterning of the nanoparticle layer. The present application may complete patterning of the nanoparticle layer without adopting ink-jet printing and can form nanoparticles with a high resolution and a good performance. When the nanoparticles include quantum dots, a resolution of quantum dot patterning may be improved, so that a display device with a better display performance is achieved.

Descriptions will be made below with a nanometer particle being a quantum dot and a first ligand being of a structure as shown in FIG. 8 as an example.

In order to realize full-color display, a quantum dot layer generally includes patterned quantum dots with different colors. The embodiment of the present application takes the quantum dot layer including a first quantum dot layer, a second quantum dot layer, and a third quantum dot layer as an example. The method for patterning the nanoparticle layer provided by the embodiment of the present application is described in detail in combination with the accompanying drawings.

Figure 10:
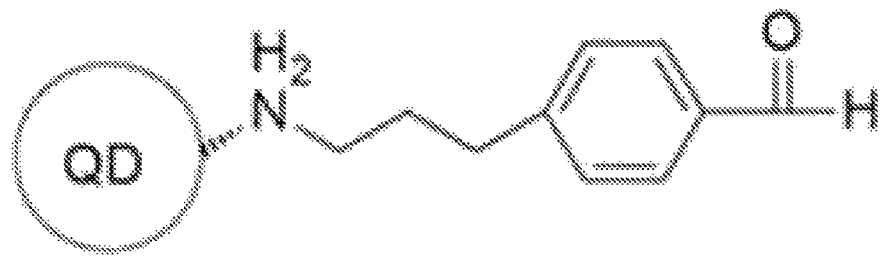
FIG. 10 is a specific schematic structural diagram of a nanoparticle provided by an embodiment of the present application.

A quantum dot solution is prepared, taking the quantum dot being CdS/CdSe as an example, as shown in FIG. 10. The quantum dot has a first ligand A:

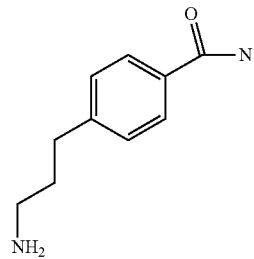

coordinated on a surface, and the quantum dots CdS/CdSe containing the first ligands A are prepared by following steps: using purchased CdS/CdSe quantum dots as original quantum dots, using oleic acid as a ligand molecule, and using toluene as a solvent, where a concentration is 10 mg/ml; taking 100 mg of the purchased quantum dots, and placing 10 ml in a 50 ml three-necked flask; adding 5 ml of a chlorobenzene solution of the first ligand A (concentration 100 mg/ml) to the three-necked flask under a nitrogen atmosphere, and stirring at room temperature for 24 hours to complete the exchange; after the reaction, submerging the solution in normal octane to separate out a precipitate, performing a centrifugation at a speed of about 8000 rpm, and discarding a supernatant; and adding chlorobenzene to dissolve and then submerging the solution in normal octane again to separate out a precipitate, and discarding a supernatant after centrifugation; adding chlorobenzene to prepare a 15 mg/ml solution, and preparing a first quantum dot solution, a second quantum dot solution, and a third quantum dot solution with different colors respectively.

Figure 11A:
FIG. 11A is a schematic structural diagram of a first structure after executing a method for patterning a nanoparticle layer provided by an embodiment of the present application.

As shown in FIG. 11A, the first quantum dot solution is coated on a substrate 1 in a spin-coating mode to form a first film layer 2.

Figure 11B:
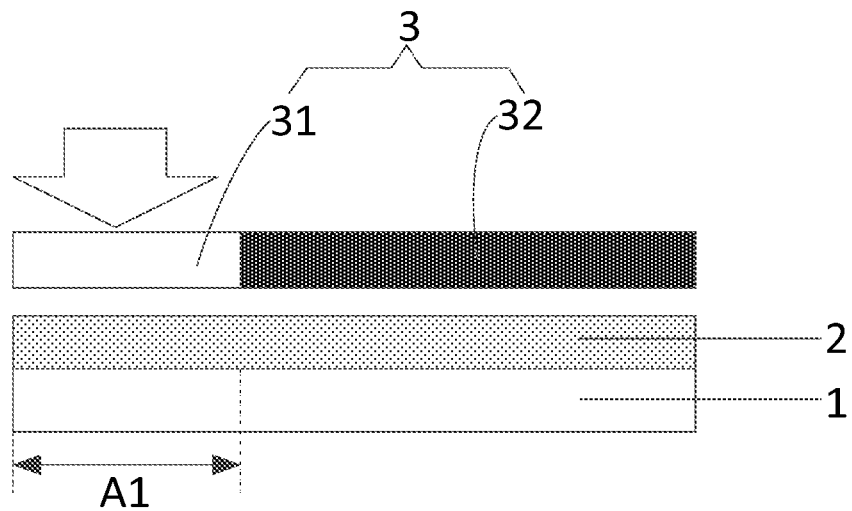
FIG. 11B is a schematic structural diagram of a second structure after executing a method for patterning a nanoparticle layer provided by an embodiment of the present application.

In some embodiments, as shown in FIG. 11B, the ultraviolet light (shown in a direction of an arrow in the figure) is used to irradiate a first quantum dot reserved area A1 of the first film layer 2, and the first quantum dot reserved area A1 corresponds to an area where a first quantum dot layer needs to be formed subsequently. In some embodiments, in the above-mentioned patterning method provided by the embodiment of the present application, the ultraviolet light may be used to irradiate the first film layer 2. When the first film layer 2 is irradiated, a mask 3 may be used to shield the first film layer 2. The mask 3 includes a light transmitting area 31 and a light shielding area 32, and the light transmitting area 31 corresponds to the first quantum dot reserved area A1 that is irradiated with the light in the first film layer 2.

In particular, 365 nm ultraviolet light may be used to irradiate for about 20 minutes.

Under irradiation of the ultraviolet light, as shown in FIG. 10, nanometer particles QD of the nanoparticles absorb photons to generate electrons in an excited state, and the electrons are delocalized to surfaces of the nanometer particles QD to be in contact with the first ligands

Figure 12:
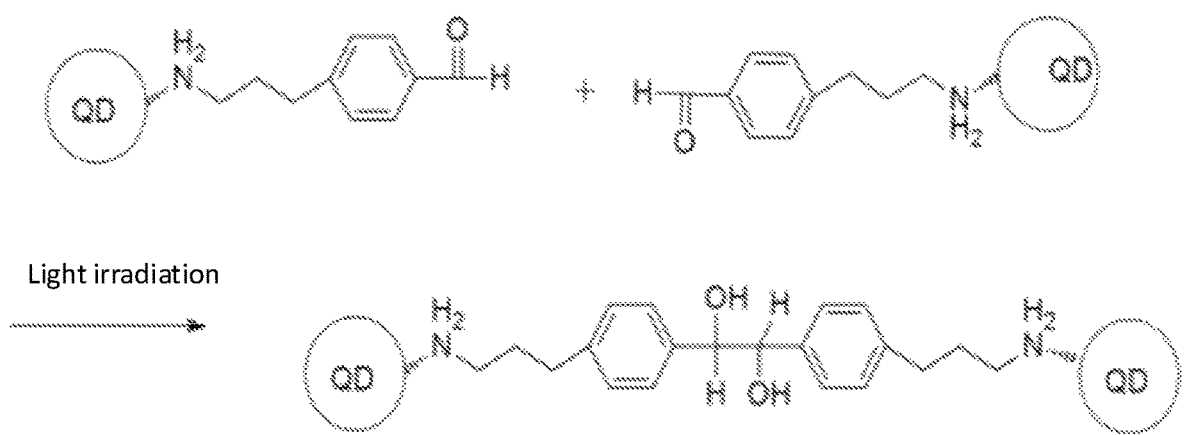
FIG. 12 is a schematic diagram of a mechanism of a reaction of the nanoparticle shown in FIG. 10 under an action of ultraviolet light.

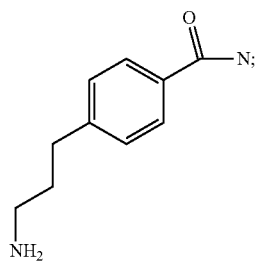

and as shown in FIG. 12, under the action of the transfer reaction of the electrons generated under irradiation of the ultraviolet light, carbonyls of the first ligands

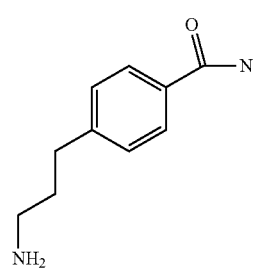

of adjacent nanoparticles are subjected to carbon-carbon coupling under the action of generated radicals, so that the nanoparticles are cross-linked together and a structure of the cross-linked network firmly connected with the substrate 1 is formed in the first quantum dot reserved area A1.

Figure 11C:
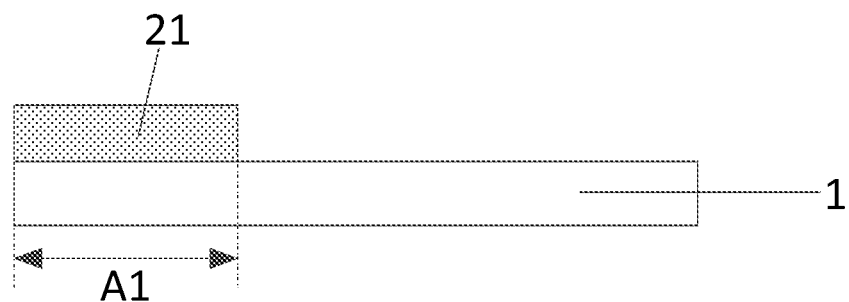
FIG. 11C is a schematic structural diagram of a third structure after executing a method for patterning a nanoparticle layer provided by an embodiment of the present application.

As shown in FIG. 11C, a solvent (such as chlorobenzene or other solvents) is used to clean the first film layer 2 irradiated by the ultraviolet light, nanoparticles (first quantum dots) in an area not irradiated by the ultraviolet light of the first film layer 2 are dissolved in the above-mentioned solvent to be washed away, and the adjacent quantum dots in the first quantum dot reserved area A1 are cross-linked and are not dissolved in the above-mentioned solvent, forming a patterned first quantum dot layer 21.

In order to densely coagulate the nanoparticles in the patterned nanoparticle layer to form a pattern, after the patterned nanoparticle layer (the first quantum dot layer 21) is formed, the above-mentioned patterning method provided by the embodiment of the present application may further include:

drying and annealing the patterned nanoparticle layer (the first quantum dot layer 21). After drying and annealing, the nanoparticle layer can be more densely coagulated. In specific implementation, process parameters of drying and annealing may be set according to actual production needs. For example, annealing may be performed at a temperature of around 120° C. for around 20 minutes.

Figure 11D:
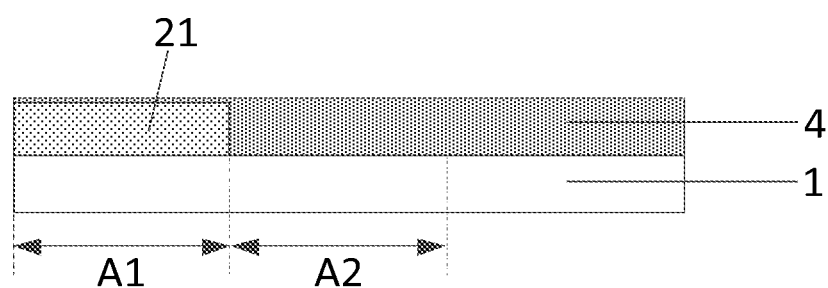
FIG. 11D is a schematic structural diagram of a fourth structure after executing a method for patterning a nanoparticle layer provided by an embodiment of the present application.

Then, as shown in FIG. 11D, the second quantum dot solution is coated by a spin-coating mode on the substrate 1 on which the first quantum dot layer 21 is formed to form a second film layer 4.

Figure 11E:
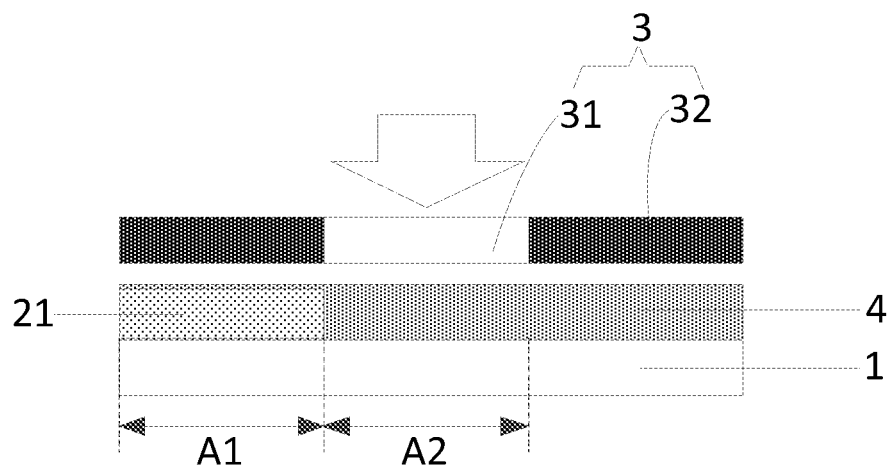
FIG. 11E is a schematic structural diagram of a fifth structure after executing a method for patterning a nanoparticle layer provided by an embodiment of the present application.

In some embodiments, as shown in FIG. 11E, the ultraviolet light (shown in a direction of an arrow in the figure) is used to irradiate a second quantum dot reserved area A2 of the second film layer 4, and the second quantum dot reserved area A2 corresponds to an area where a second quantum dot layer needs to be formed subsequently. In some embodiments, in the above-mentioned patterning method provided by the embodiment of the present application, the ultraviolet light may be used to irradiate the second film layer 4. When the second film layer 4 is irradiated, the mask 3 may be used to shield the second film layer 4. The mask 3 includes the light transmitting area 31 and the light shielding area 32, and the light transmitting area 31 corresponds to the second quantum dot reserved area A2 that is irradiated with the light in the second film layer 4.

In particular, 365 nm ultraviolet light may be used to irradiate for about 20 minutes.

Under irradiation of the ultraviolet light, as shown in FIG. 10, nanometer particles QD of the nanoparticles absorb photons to generate electrons in an excited state, and the electrons are delocalized to surfaces of the nanometer particles QD to be in contact with the first ligands

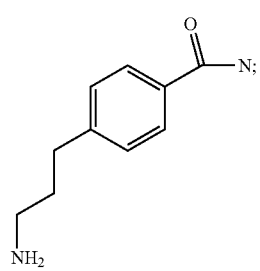

and as shown in FIG. 12, under the action of the transfer reaction of the electrons generated under irradiation of the ultraviolet light, carbonyls of the first ligands

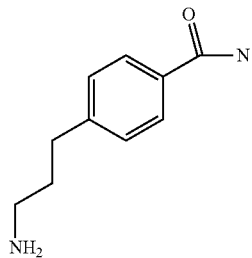 [SMILES: NCCCc1ccc(C(N)=O)cc1]

of adjacent nanoparticles are subjected to carbon-carbon coupling under the action of generated radicals, so that the nanoparticles are cross-linked together and a structure of the cross-linked network firmly connected with the substrate 1 is formed in the second quantum dot reserved area A2.

Figure 11F:
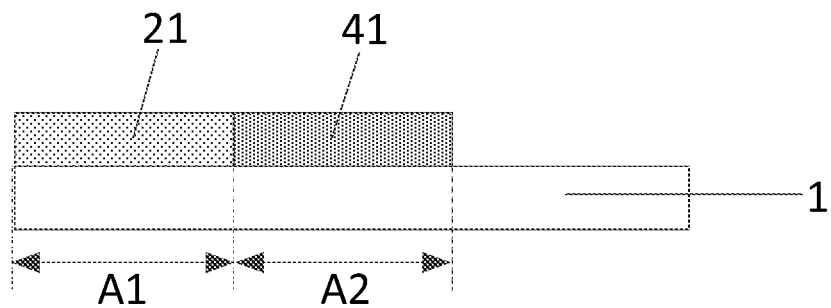
FIG. 11F is a schematic structural diagram of a sixth structure after executing a method for patterning a nanoparticle layer provided by an embodiment of the present application.

As shown in FIG. 11F, a solvent (such as chlorobenzene or other solvents) is used to clean the second film layer 4 irradiated by the ultraviolet light, nanoparticles (second quantum dots) in an area not irradiated by the ultraviolet light of the second film layer 4 are dissolved in the above-mentioned solvent to be washed away, and the adjacent quantum dots in the second quantum dot reserved area A2 are cross-linked and are not dissolved in the above-mentioned solvent, forming a patterned second quantum dot layer 41.

In some embodiments, in order to densely coagulate the nanoparticles in the patterned nanoparticle layer to form a pattern, after the patterned nanoparticle layer (the second quantum dot layer 41) is formed, the above-mentioned patterning method provided by the embodiment of the present application may further include:

drying and annealing the patterned nanoparticle layer (the second quantum dot layer 41). After drying and annealing, the nanoparticle layer can be more densely coagulated. In specific implementation, process parameters of drying and annealing may be set according to actual production needs. For example, annealing may be performed at a temperature of around 120° C. for around 20 minutes.

Figure 11G:
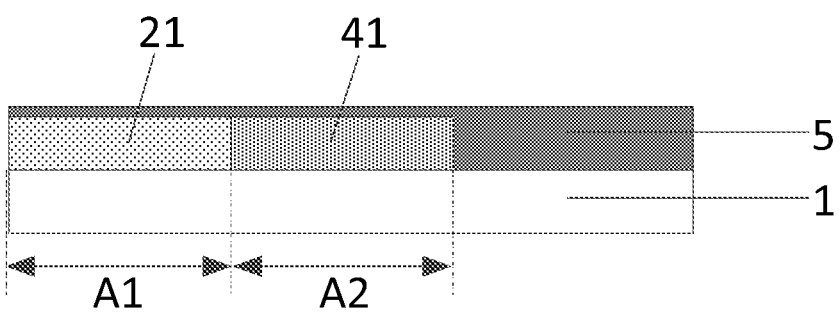
FIG. 11G is a schematic structural diagram of a seventh structure after executing a method for patterning a nanoparticle layer provided by an embodiment of the present application.

Finally, as shown in FIG. 11G, the third quantum dot solution is coated in a spin-coating mode on the substrate 1 on which the second quantum dot layer 41 is formed to form a third film layer 5.

Figure 11H:
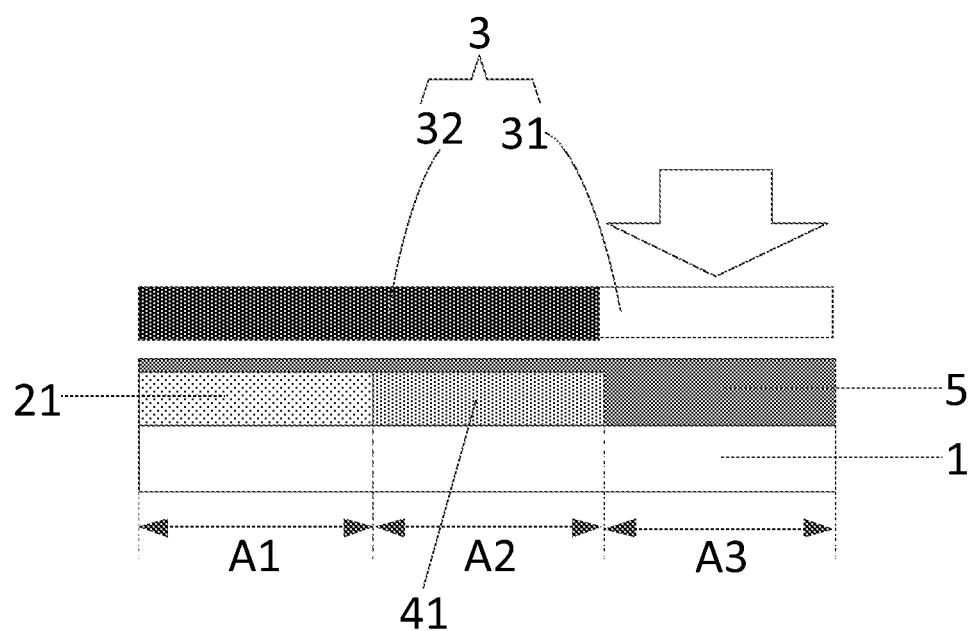
FIG. 11H is a schematic structural diagram of an eighth structure after executing a method for patterning a nanoparticle layer provided by an embodiment of the present application.

In some embodiments, as shown in FIG. 11H, the ultraviolet light (shown in a direction of an arrow in the figure) is used to irradiate a third quantum dot reserved area A3 of the third film layer 4, and the third quantum dot reserved area A3 corresponds to an area where a third quantum dot layer needs to be formed subsequently. In some embodiments, in the above-mentioned patterning method provided by the embodiment of the present application, the ultraviolet light may be used to irradiate the third film layer 5. When the third film layer 5 is irradiated, the mask 3 may be used to shield the third film layer 5. The mask 3 includes the light transmitting area 31 and the light shielding area 32, and the light transmitting area 31 corresponds to the third quantum dot reserved area A3 that is irradiated with the light in the third film layer 5.

In particular, 365 nm ultraviolet light may be used to irradiate for about 20 minutes.

Under irradiation of the ultraviolet light, as shown in FIG. 10, nanometer particles QD of the nanoparticles absorb photons to generate electrons in an excited state, and the electrons are delocalized to surfaces of the nanometer particles QD to be in contact with the first ligands

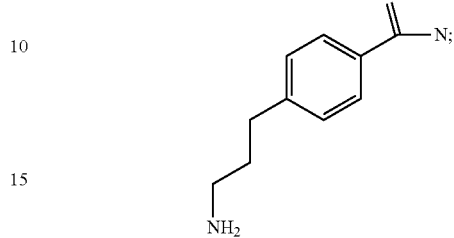

and as shown in FIG. 12, under the action of the transfer reaction of the electrons generated under irradiation of the ultraviolet light, carbonyls of the first ligands

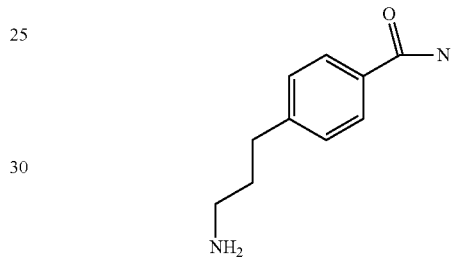

of adjacent nanoparticles are subjected to carbon-carbon coupling under the action of generated radicals, so that the nanoparticles are cross-linked together and a structure of the cross-linked network firmly connected with the substrate 1 is formed in the third quantum dot reserved area A3.

Figure 11I:
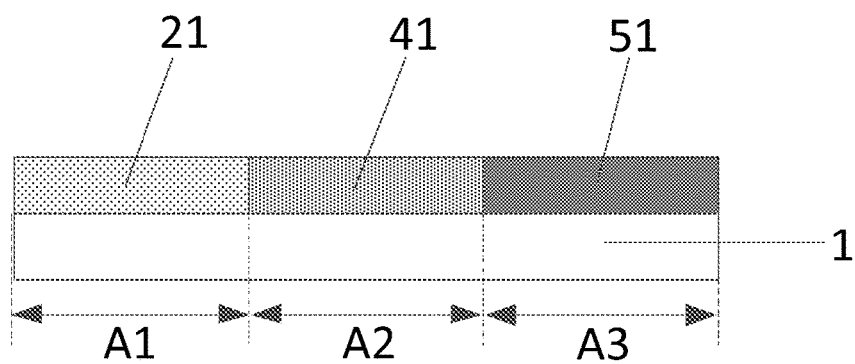
FIG. 11I is a schematic structural diagram of a ninth structure after executing a method for patterning a nanoparticle layer provided by an embodiment of the present application.

As shown in FIG. 11I, a solvent (such as chlorobenzene or other solvents) is used to clean the third film layer 5 irradiated by the ultraviolet light, the nanoparticles (third quantum dots) in an area not irradiated by the ultraviolet light of the third film layer 5 are dissolved in the above-mentioned solvent to be washed away, and the adjacent quantum dots in the third quantum dot reserved area A3 are cross-linked and are not dissolved in the above-mentioned solvent, forming a patterned third quantum dot layer 51.

In some embodiments, in order to densely coagulate the nanoparticles in the patterned nanoparticle layer to form a pattern, after the patterned nanoparticle layer (the third quantum dot layer 51) is formed, the above-mentioned patterning method provided by the embodiment of the present application may further include:

drying and annealing the nanoparticle layer (the third quantum dot layer 51). After drying and annealing, the nanoparticle layer can be more densely coagulated. In specific implementation, process parameters of drying and annealing may be set according to actual production needs. For example, annealing may be performed at a temperature of around 120° C. for around 20 minutes.

In some embodiments, color of light emitted by the first quantum dot layer, color of light emitted by the second quantum dot layer, and color of light emitted by the third quantum dot layer in the embodiment of the present application are red, green, and blue, respectively. In this way, the embodiment of the present application completes a patterning process of full-color quantum dots through the above patterning method. The embodiment of the present application may complete patterning of the nanoparticle layer without adopting ink-jet printing and can form nanoparticles with a high resolution and a good performance.

Based on the same inventive concept, an embodiment of the present application further provides a method for manufacturing a light emitting device, including manufacturing an anode, a nanoparticle layer, and a cathode. The nanoparticle layer (quantum dot layer) is formed by the above-mentioned method for patterning the nanoparticle layer.

Figure 13:
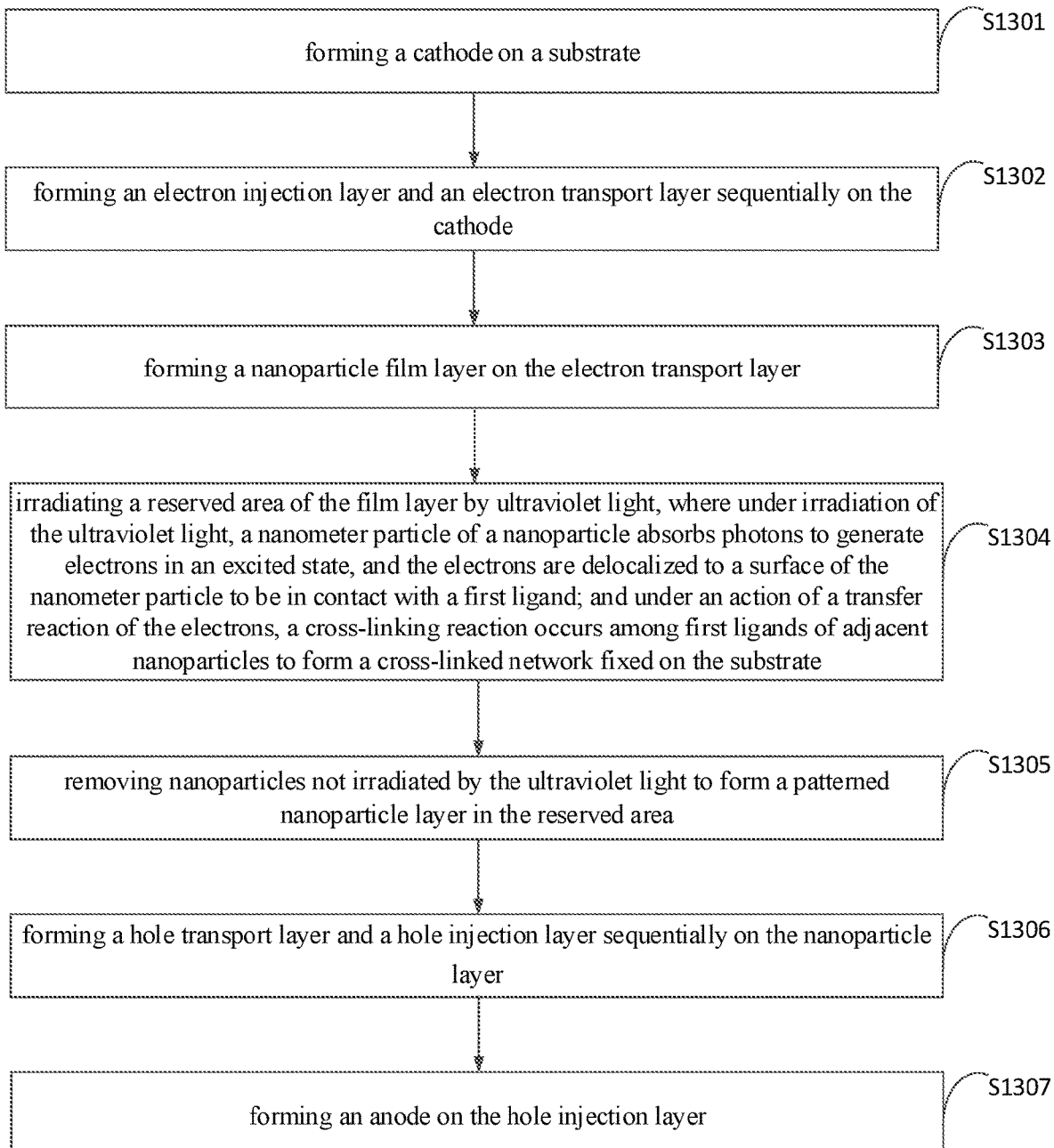
FIG. 13 is a flow chart of a method for manufacturing a light emitting device provided by an embodiment of the present application.

In some embodiments, the light emitting devices include upright structures and inverted structures. Taking the light emitting device of an inverted structure as an example, forming the light emitting device, as shown in FIG. 13, may include as follows.

S1301, forming a cathode on a substrate.

S1302, forming an electron injection layer and an electron transport layer sequentially on the cathode.

S1303, forming a nanoparticle film layer on the electron transport layer.

S1304, irradiating a reserved area of the film layer by ultraviolet light. Under irradiation of the ultraviolet light, a nanometer particle of a nanoparticle absorbs photons to generate electrons in an excited state, and the electrons are delocalized to a surface of the nanometer particle to be in contact with a first ligand; and under the action of the transfer reaction of the electrons, a cross-linking reaction occurs among first ligands of adjacent nanoparticles to form a cross-linked network fixed on the substrate.

S1305, removing nanoparticles not irradiated by the ultraviolet light to form a patterned nanoparticle layer in the reserved area.

S1306, forming a hole transport layer and a hole injection layer sequentially on the nanoparticle layer.

S1307, forming the anode on the hole injection layer.

Specific methods of foregoing steps S1301, S1302, S1306, and S1307 provided by the specific embodiment of the present application are the same as those in the prior art, and will not be repeatedly described here; foregoing steps S1303, S1304, and S1305 are similar to foregoing steps S901, S902, and S903, and will not be repeatedly described here.

In some embodiments, the substrate provided by the embodiment of the present application may include a base substrate, a driving circuit located on the base substrate, and a passivation layer, a flat layer and other structures located above the driving circuit.

In some embodiments, after the cathode is manufactured, the embodiment of the present application further includes a packaging process, a cutting process, and a bonding process of the light emitting device. These processes are the same as those in the prior art, and will not be repeatedly described here.

The manufacturing method of the light emitting device of the inverted structure provided by the embodiment of the present application will be described below with reference to FIG. 14.

First, the substrate 1 is manufactured: the base substrate is cleaned by adopting a standard method, then gate metal (such as Mo, with a thickness of about 200 nm), a gate insulating layer (such as $SiO_2$, with a thickness of about 150 nm), an active layer (such as an IGZO material, with a thickness of about 40 nm), a source and drain metal (such as Mo, with a thickness of about 200 nm), the passivation layer (such as a $SiO_2$ material, with a thickness of about 300 nm), and a pixel electrode (such as an ITO material, with a thickness of about 40 nm) are sequentially deposited and patterned on the base substrate; and finally an acrylic material is subjected to spin-coated deposition and a pixel defining layer is achieved through photolithography and curing, with a thickness of about 1.5 um, and a TFT backplane part (i.e. the substrate 1 of the present application) is formed.

Then, before the cathode 6 is formed, a surface of the formed substrate 1 is subjected to plasma treatment.

Then, the cathode 6 is manufactured on the substrate 1. A material of the cathode may be LiF, Al, etc., and a thickness of the cathode may range from 500 nm to 1000 nm. A manufacturing method of the cathode 6 is the same as that in the prior art, and will not be described in detail here.

Then, the electron injection layer 7 is formed on the cathode 6 in a spin-coating mode or by an evaporation process, and the electron transport layer 8 is formed on the electron injection layer 7 in a spin-coating mode or by an evaporation process. A material of the electron injection layer 7 may be LiF, etc. A material of the electron transport layer 8 may be ZnO nanoparticles, etc. Manufacturing methods of the electron injection layer 7 and the electron transport layer 8 are the same as those in the prior art, and will not be described in detail here.

Then, a quantum dot layer including a first quantum dot layer 21, a second quantum dot layer 41, and a third quantum dot layer 51 is formed on the electron transport layer 8 by using the above-mentioned method for patterning the nanoparticle layer.

Then, the hole transport layer 9 and the hole injection layer 10 are sequentially manufactured on the quantum dot layer by an evaporation process. A material of the hole transport layer 9 may be TFB, etc., and a material of the hole injection layer 10 may be PEDOT:PSS, etc. An overall thickness of the hole injection layer 9 and the hole transport layer 10 may range from 50 nm to 100 nm.

Subsequently, the anode 11 is vapor-deposited on the hole injection layer 10, and manufacturing methods of the hole transport layer 9, the hole injection layer 10 and the anode 11 are the same as those in the prior art, and will not be described in detail here.

It should be noted that the embodiment of the present application takes the light emitting device of the inverted structure as an example to illustrate the manufacturing method. When the light-emitting device is of the upright structure, a difference from the inverted structure is that in the upright structure, the anode, the hole injection layer, the hole transport layer, the nanoparticle layer, the electron transport layer, the electron injection layer, and the cathode are sequentially formed on the substrate, which will not be described in detail here.

Figure 14:
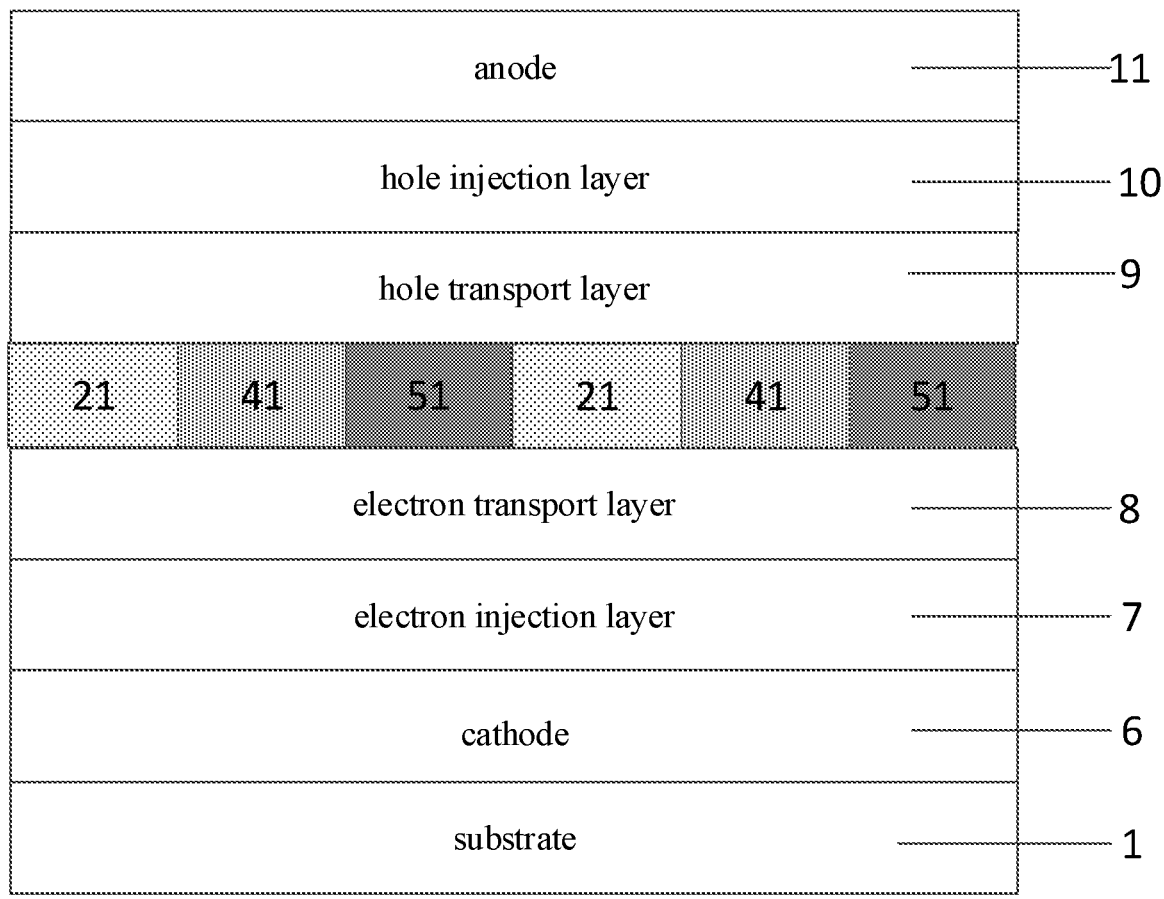
FIG. 14 is a schematic structural diagram of a light emitting device provided by an embodiment of the present application.

Based on the same inventive concept, an embodiment of the present application further provides a light emitting device, as shown in FIG. 14, including an anode 11, nanoparticle layers (21, 41, 51) and a cathode 6 which are arranged in a stacked mode. The nanoparticle layers include nanometer particles QD and a cross-linked network, attached to surfaces of the nanometer particles QD and formed by a cross-linking reaction of first ligands A of the nanoparticles provided by the embodiment of the present application.

In some embodiments, in the light emitting device provided by the embodiment of the present application, a structure, of first ligands on surfaces of nanometer particles in the nanoparticle layers (21, 41, 51) as shown in FIG. 14, without cross-linking reaction, may be shown as FIG. 3. The cross-linking reaction is triggered by irradiation of ultraviolet light and an action of carbon tetrachloride and oxygen, and resulting in a cross-linked network structure of

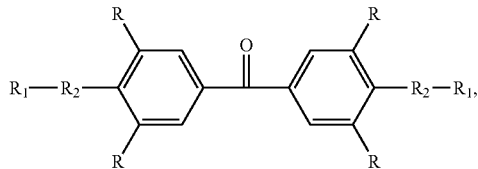

i.e. a plurality of nanometer particles in the nanoparticle layers (21, 41, 51) in FIG. 14 are joined by

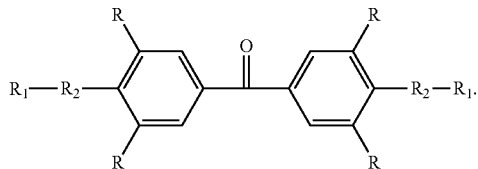

In some embodiments, in the light emitting device provided by the embodiment of the present application, a structure, of the firsts ligand on the surfaces of the nanometer particles in the nanoparticle layers (21, 41, 51) as shown in FIG. 14, without the cross-linking reaction, may be shown as FIG. 4. Under the action of the transfer reaction of the electrons caused by irradiation of the ultraviolet light, carbonyl opens a double bond of the carbonyl under an action of generated free radicals to form radicals for carbon-carbon coupling, i.e. the cross-linking reaction occurs, and the structure of the formed cross-linked network is

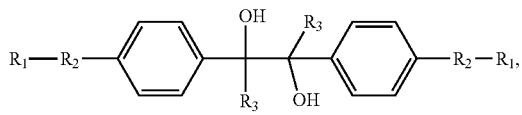

i.e. the plurality of nanometer particles in the nanoparticle layers (21, 41, 51) in FIG. 14 are joined by

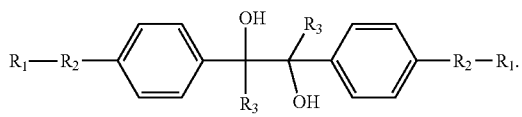

Optionally, in the light emitting device provided by the embodiment of the present application, a structure, of first ligands on surfaces of a first part of nanometer particles in the nanoparticle layers (21, 41, 51) as shown in FIG. 14, without the cross-linking reaction, may be shown as FIG. 5, and a structure, of first ligands on surfaces of a second part of nanometer particles, without the cross-linking reaction, may be shown as FIG. 6. Under the action of the transfer reaction of the electrons caused by irradiation of the ultraviolet light, a cross-linking effect is achieved through an addition ring-forming reaction between a double bond in FIG. 5 and a double bond in FIG. 6. That is, the cross-linking reaction occurs, and the structure of the formed cross-linked network is

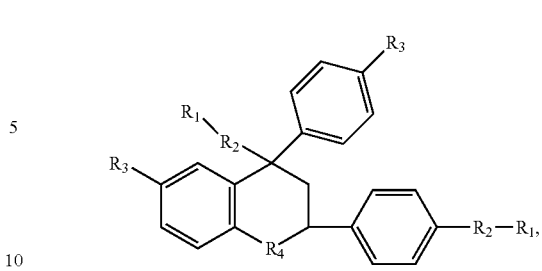

i.e. the plurality of nanometer particles in the nanoparticle layers (21, 41, 51) in FIG. 14 are joined by

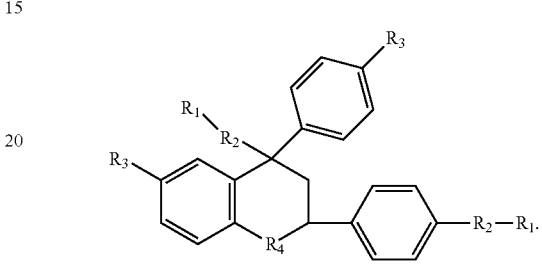

Based on the same inventive concept, an embodiment of the present application further provides a display device, including the above-mentioned light emitting device provided by the embodiment of the present application. The problem-solving principle of the display device is similar to that of the aforementioned light emitting device. Therefore, implementation of the display device may be referred to implementation of the aforementioned light emitting device, and repetitive parts will not be described here.

In specific implementation, the above-mentioned display device provided by the embodiment of the present application is an organic light emitting display device.

In specific implementation, the above-mentioned display device provided by the embodiment of the present application may be a full-screen display device, or may also be a flexible display device, etc., which is not limited herein.

Figure 15:
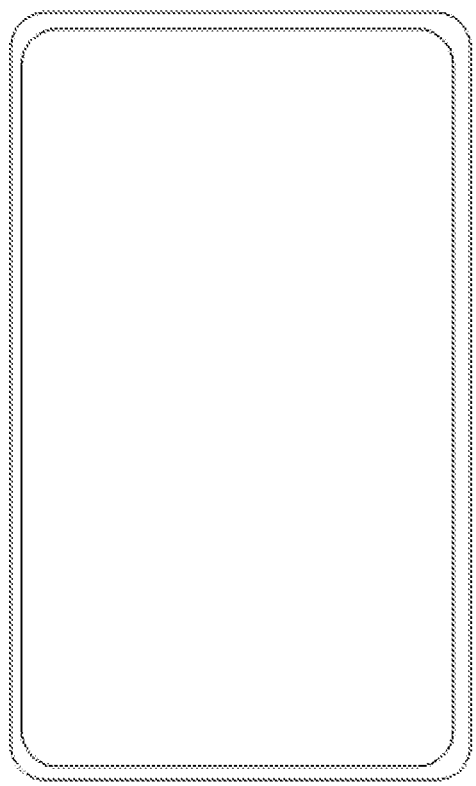
FIG. 15 is a schematic structural diagram of a display device provided by an embodiment of the present application.

In specific implementation, the above-mentioned display device provided by the embodiment of the present application may be a full-screen mobile phone as shown in FIG. 15. The display device may also be any product or component with a display function, such as a tablet computer, a television, a display, a notebook computer, a digital photo frame, and a navigator. Other indispensable components of the display device should be understood by those of ordinary skill in the art, and will not be repeated here, nor should they be constructed as a limitation to the present application. Implementations of the display device may be referred to the embodiment of the above-mentioned quantum dot light emitting device, and repetitive parts will not be described here.

In specific implementation, the display device provided by the embodiment of the present application may further include other functional film layers well known to those of skill in the art, which will not be described in detail here.

According to the nanoparticle, the method for patterning the nanoparticle layer, the light emitting device, and the display device provided by the embodiments of the present application, the nanoparticle includes: the nanometer particle, and the first ligand coordinated on the surface of the nanometer particle; the nanometer particle is configured to generate the electrons in an excited state under irradiation of the ultraviolet light, and the electrons are delocalized to the surface of the nanometer particle; and the cross-linking reaction occurs among the first ligands under the action of the transfer reaction of the electrons. When the nanoparticle provided by the present application is adopted for manufacturing the light emitting layer of the light emitting device, the cross-linking reaction occurs among the first ligands of the adjacent nanoparticles under irradiation of the ultraviolet light, and the cross-linked nanoparticles may be firmly connected to the front film layer of the light emitting layer, so that when the developing solution is adopted for developing treatment, the cross-linked nanoparticles are not insoluble in the developing solution and are retained while the non-cross-linked nanoparticles are dissolved in the developing solution and are separated from the front film layer to be removed, therefore completing patterning of the nanoparticle layer. The present application may complete patterning of the nanoparticle layer without adopting ink-jet printing and can form nanoparticles with the high resolution and the good performance. When the nanoparticles include the quantum dots, the resolution of the quantum dot patterning may be improved, so that the display apparatus with the better display performance is achieved.

Apparently, those of skill in the art may make various modifications and variations to the present application without departing from the spirit and scope of the present application. In this way, if these modifications and variations of the present application fall within the scope of the claims of the present application and their equivalent technologies, the present application is also intended to include these modifications and variations.

What is claimed is:

1. A nanoparticle, comprising: a nanometer particle, and a first ligand coordinated on a surface of the nanometer particle; wherein
   under irradiation of ultraviolet light, the nanometer particle is configured to absorb photons to generate electrons in an excited state, and the electrons are delocalized to the surface of the nanometer particle to be in contact with the first ligand; and
   under an action of a transfer reaction of the electrons, a cross-linking reaction occurs among first ligands of adjacent nanoparticles.

2. The nanoparticle of claim 1, wherein the first ligand comprises: a cross-linking group, a linking group joined to the cross-linking group, and a coordinating group joined to the linking group; and wherein
   the coordinating group is configured to be in coordinate bond with the nanometer particle; and
   under the action of the transfer reaction of the electrons, the cross-linking reaction occurs among cross-linking groups.

3. The nanoparticle of claim 2, wherein the first ligand is

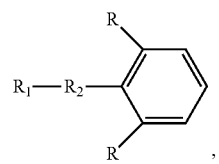

and wherein
$R_1$ is the coordinating group, and $R_1$ is —$NH_2$, —SH, —COOH or —P=O;
$R_2$ is the linking group, $R_2$ is $(CH_2)_n$, and $n \leq 8$; and

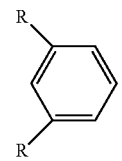

is the cross-linking group, R is an electron donating group, and R is —$O^-$, —$NR_2$, —$NH_2$, —OH, —OR, —NHCOR or —OCOR.

4. The nanoparticle of claim 3, wherein the cross-linking groups undergo the cross-linking reaction under irradiation of the ultraviolet light and under an action of carbon tetrachloride and oxygen:

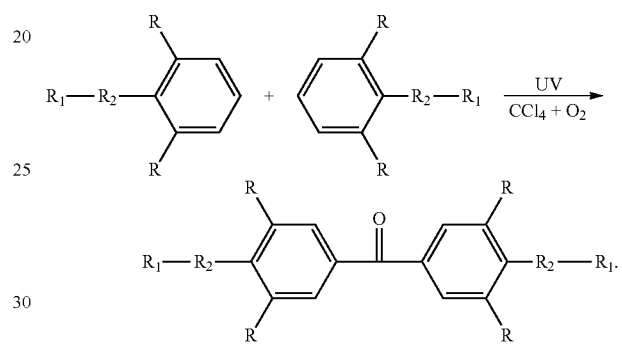

5. The nanoparticle of claim 2, wherein the first ligand is

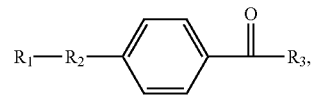

and wherein
$R_1$ is the coordinating group, and $R_1$ is —$NH_2$, —SH, —COOH or —P=O;
$R_2$ is the linking group, $R_2$ is $(CH_2)_n$ or

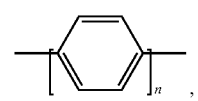

and $n \leq 8$; and

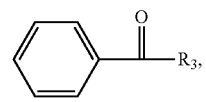

is the cross-linking group, $R_3$ is H or $(CH_2)_n CH3$, and $n \leq 8$.

6. The nanoparticle of claim 5, wherein the cross-linking groups undergo the cross-linking reaction under irradiation of the ultraviolet light:

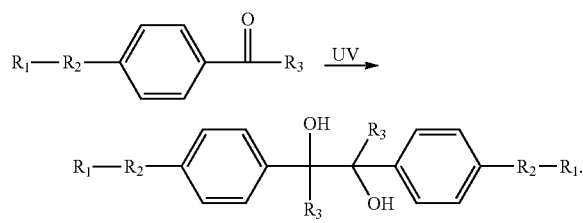

7. The nanoparticle of claim 2, wherein in a plurality of nanoparticles, each first ligand of a first part of the plurality of nanoparticles is

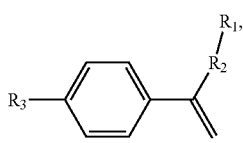

and each first ligand of a second part of the plurality of nanoparticles is

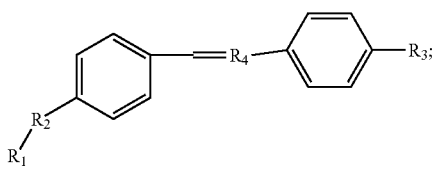

and wherein $R_1$ is the coordinating group, and $R_1$ is —$NH_2$, —SH, —COOH or —P=O;

$R_2$ is the linking group, $R_2$ is $(CH_2)_n$, and n≤8;

is the cross-linking group of the first part of the plurality of nanoparticles, $R_3$ is $(CH_2)_n CH3$, and n≤8; and

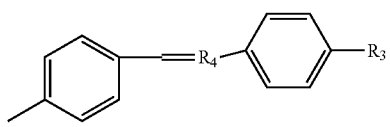

is the cross-linking group of the second part of the plurality of nanoparticles, $R_3$ is $(CH_2)_n CH3$, n≤8, and $R_4$ is CH or N.

8. The nanoparticle of claim 7, wherein the cross-linking group of the first part of the plurality of nanoparticles and the cross-linking group of the second part of the plurality of nanoparticles undergo the cross-linking reaction under irradiation of the ultraviolet light:

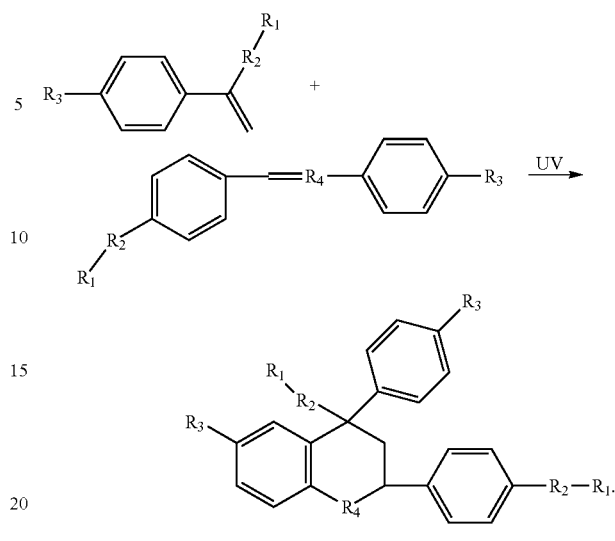

9. The nanoparticle of claim 1, wherein the nanoparticle comprises a quantum dot:
the quantum dot is a nanometer particle with an inorganic core structure, and the first ligand is coordinated on a surface of the nanometer particle with the inorganic core structure;
or, the quantum dot is a nanometer particle with an inorganic core structure and an inorganic shell structure, the first ligand is coordinated on a surface of the nanometer particle with the inorganic core structure and the inorganic shell structure, and a band gap of a material of the inorganic shell structure is smaller than a band gap of a material of the inorganic core structure.

10. A method for patterning a nanoparticle layer, comprising:
forming a nanoparticle film layer on a substrate, wherein the nanoparticle film layer comprises the nanoparticle of claim 1;
irradiating a reserved area of the nanoparticle film layer with ultraviolet light, wherein under irradiation of the ultraviolet light, a nanometer particle of the nanoparticle absorbs photons to generate electrons in an excited state, and the electrons are delocalized to a surface of the nanometer particle to be in contact with a first ligand; and under an action of a transfer reaction of the electrons, a cross-linking reaction occurs among first ligands of adjacent nanoparticles to form a cross-linked network fixed on the substrate; and
removing nanoparticles not irradiated by the ultraviolet light to form a patterned nanoparticle layer in the reserved area.

11. The method of claim 10, wherein the irradiating the reserved area of the nanoparticle film layer with the ultraviolet light comprises:
using a mask to shield the nanoparticle film layer, wherein the mask comprises a light transmitting area and a light shielding area, and the light transmitting area corresponds to the reserved area receiving light irradiation in the nanoparticle film layer.

12. The method of claim 10, wherein the removing the nanoparticles not irradiated by the ultraviolet light comprises:
using a solvent to clean the nanoparticle film layer irradiated by the ultraviolet light, wherein nanoparticles in an area of the nanoparticle film layer not irradiated by the ultraviolet light are dissolved in the solvent, and first ligands of adjacent nanoparticles in the reserved area are cross-linked and the nanoparticles in the reserved area are not dissolved in the solvent.

13. The method of claim 10, wherein after the patterned nanoparticle layer is formed, the method further comprises:
drying and annealing for the patterned nanoparticle layer.

14. A light emitting device, comprising an anode, a nanoparticle layer and a cathode arranged in a stacked mode, wherein the nanoparticle layer comprises a nanometer particle and a cross-linked network attached to a surface of the nanometer particle, and formed by a cross-linking reaction of a first ligand of the nanoparticle of claim 1.

15. The light emitting device of claim 14, wherein a structure of the cross-linked network formed by the cross-linking reaction of the first ligand on the surface of the nanometer particle is:

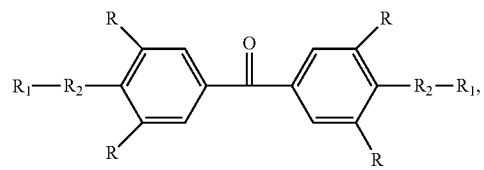

and a plurality of nanometer particles of the nanoparticle layer are joined by

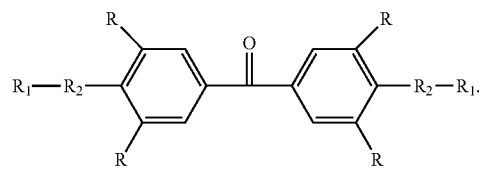

16. The light emitting device of claim 14, wherein a structure of the cross-linked network formed by the cross-linking reaction of the first ligand on the surface of the nanometer particle is:

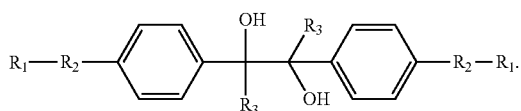

and a plurality of nanometer particles of the nanoparticle layer are joined by

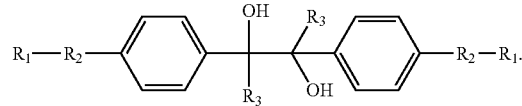

17. The light emitting device of claim 14, wherein a structure of the cross-linked network formed by the cross-linking reaction of the first ligand on the surface of the nanometer particle is:

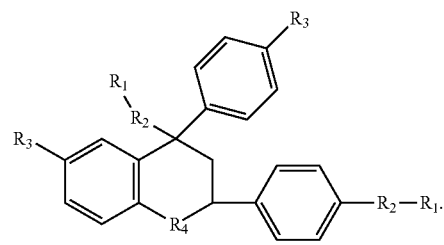

and a plurality of nanometer particles of the nanoparticle layer are joined by

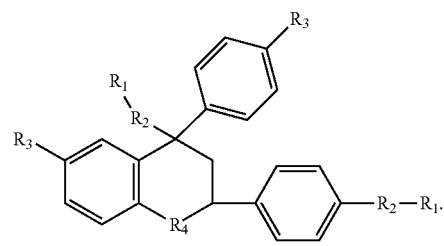

18. A display device, comprising the light emitting device of claim 14.

* * * * *